United States Patent
Komiak (10) Patent No.: US 9,899,966 B2
(45) Date of Patent: Feb. 20, 2018

(54) WIDEBAND HIGH DYNAMIC RANGE LOW NOISE AMPLIFIER

(71) Applicant: BAE Systems Information and Electronic Systems Integration Inc., Nashua, NH (US)

(72) Inventor: James J. Komiak, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/183,865

(22) Filed: Jun. 16, 2016

(65) Prior Publication Data

US 2017/0366143 A1    Dec. 21, 2017

(51) Int. Cl.
  *H03F 1/42*   (2006.01)
  *H03F 3/195*  (2006.01)
  *H03F 1/38*   (2006.01)

(52) U.S. Cl.
  CPC ............... *H03F 1/38* (2013.01); *H03F 1/42* (2013.01); *H03F 3/195* (2013.01); *H03F 2200/294* (2013.01); *H03F 2200/451* (2013.01)

(58) Field of Classification Search
  USPC ........................................ 330/149, 151, 307
  See application file for complete search history.

(56) References Cited

U.S. PATENT DOCUMENTS

| | | |
|---|---|---|
| 4,636,745 A | 1/1987 | Ryuichi |
| 6,107,885 A | 8/2000 | Miguelez et al. |
| 6,133,793 A | 10/2000 | Lau et al. |
| 6,614,298 B2 * | 9/2003 | Blodgett ............... H03F 1/3235 330/151 |
| 7,035,616 B2 | 4/2006 | Reynolds |
| 7,053,718 B2 | 5/2006 | Dupuis et al. |
| 7,091,782 B2 * | 8/2006 | Jacob .................... H03F 1/3229 330/149 |
| 7,193,475 B2 | 3/2007 | Su et al. |
| 7,205,844 B2 | 4/2007 | Su et al. |
| 9,203,349 B2 | 12/2015 | Lin et al. |

* cited by examiner

*Primary Examiner* — Hieu Nguyen
(74) *Attorney, Agent, or Firm* — Sand & Sebolt, LPA (57) ABSTRACT

A device, system and method for a wideband low noise amplifier is provided. The device may include a main amplifier and an error amplifier. In each amplifier is a phase inverter configured to invert the incoming signal. Additionally, rather than being formed from discrete components, the conductors of this wideband low noise amplifier are formed from microwave monolithic integrated circuits to provide for greater efficiency, which enables the low noise amplifier to operate in wideband rather than narrowband. A method of using the same is also provided.

21 Claims, 4 Drawing Sheets

WIDEBAND HIGH DYNAMIC RANGE LOW NOISE AMPLIFIER

BACKGROUND

Technical Field

The present disclosure relates generally to the field of low noise amplifiers. More particularly, the present disclosure relates to wideband high dynamic range low noise amplifiers. Specifically, the present disclosure relates to wideband high dynamic range low noise amplifiers utilizing phase inversion techniques and monolithic microwave integrated circuit technology.

Background Information

Due to development of wireless communication, demands for receiving/transmitting signals and data are growing. In conventional radio frequency receivers, an amplifier is often used as a first-stage component for reducing noise and amplifying signals. How to effectively promote gain of the amplifier and decrease power consumption is a primary goal in the industry.

Typically, Low Noise Amplifiers (LNA) operate in a narrowband spectrum. LNAs also typically function in a world of unknowns. As the "front end" of the receiver channel, the LNA must capture and amplify a very-low-power, low-voltage signal plus associated random noise which the antenna presents to it, within the bandwidth of interest. In signal theory, this is called the unknown signal/unknown noise challenge, the most difficult of all signal-processing challenges. However, as demands for wireless communications grows, attempts to utilize LNAs in wideband and ultra-widebands have been established. Some exemplary prior art is provided in patents: U.S. Pat. No. 4,636,745; U.S. Pat. No. 6,107,885; U.S. Pat. No. 6,133,793; U.S. Pat. No. 7,035,616; U.S. Pat. No. 7,053,718; U.S. Pat. No. 7,193,475; U.S. Pat. No. 7,205,844; and U.S. Pat. No. 9,203,349.

SUMMARY

Issues continue to exist with low noise amplifiers attempting to operate in wideband. More particularly, the prior art wideband LNAs lack high dynamic range. Further, the prior art wideband LNAs are formed from discrete components and are not monolithic. Heretofore, no prior art wideband LNAs utilize feed forward techniques (i.e., phase inversion), nor do the prior art wide band LNAs utilize monolithic microwave integrated circuits to efficiently accomplish wideband low noise amplification. The present disclosure addresses these and other issues.

A wideband low noise amplifier (LNA) having high dynamic range comprising: an input splitter to split a radio frequency power signal into a signal first pathway and a signal second pathway; a main amplifier including a first wideband phase inverter electrically connected downstream from the input splitter along the first pathway; an error amplifier including a second wideband phase inverter electrically connected downstream from the input splitter and parallel to the main amplifier along the second pathway; and a combiner electrically connected downstream to the main amplifier and the error amplifier merging the signal first and second pathways into a combined signal pathway.

In accordance with one aspect, another particular embodiment of the present disclosure may provide that the input splitter includes a first outlet and a second outlet, that the first outlet is connected to the main amplifier and the second outlet is connected to the error amplifier, and that the first and second outlet each have a decibel (dB) loss in a range from 2 dB to 4 dB. Further, the loss at the first outlet and the second outlet may be 3 dB. Further, a 18:1 bandwidth is obtained.

In accordance with one aspect, another particular embodiment of the present disclosure may provide monolithic microwave integrated circuit (MMIC) optimized conductors defining: the electrical connections between the input splitter and the main amplifier, the electrical connection between the input splitter and the error amplifier, the electrical connection between the main amplifier and the combiner, and the electrical connection between the error amplifier and the combiner. Further, the MMIC optimized conductors permit the wideband LNA to be free of amplitude and phase adjusting means and associated control networks.

In accordance with one aspect, another particular embodiment of the present disclosure may provide a first FRAP fusible link resistor network to set quiescent bias current of the main amplifier. Further, a second FRAP fusible link resistor network may set the quiescent bias current of the error amplifier.

In accordance with one aspect, another particular embodiment of the present disclosure may provide an odd-numbered amplifier stage implementation free of any subtractor function during in-phase summation in the power combiner. This embodiment or another may include a cascode transistor including a common source driving a common gate, wherein the common gate is configured in-phase establishing an unaffected subtraction property. Additionally, this embodiment or another may provide wherein the cascade transistor improves unilateral properties and the gain of 1.5 stages in the size of a one-stage amplifier.

In accordance with another aspect, an embodiment of the present disclosure may provide a method comprising the steps of: dividing a radio frequency powered input signal into a first signal and a second signal at an input splitter; inverting the first signal in a main amplifier with a first phase inverter and simultaneously delaying the second signal in a first delay device; amplifying the first signal in the main amplifier and creating distortion in the first signal when first signal is amplified; outputting the amplified first signal with distortion from the main amplifier; attenuating the amplified first signal with distortion to the input signal level with a resistive coupler; sending a portion of the amplified first signal through a second delay device to time align the signals; inverting the second signal in an error amplifier with a second phase inverter and amplifying the second signal to create an amplified second signal; and combining the amplified second signal with the portion of the amplified first signal sent through the second delay in an power combiner; wherein the first phase inverter in the main amplifier and the second phase inverter in the error amplifier eliminate a subtraction function for in-phase phase summation.

In another aspect, the disclosure may provide a device, system and method for a wideband low noise amplifier. The device may include a main amplifier and an error amplifier. In each amplifier is a phase inverter configured to invert the incoming signal. Additionally, rather than being formed from discrete components, the conductors of this wideband low noise amplifier are formed from monolithic microwave integrated circuits to provide for greater bandwidth by elimination of parasitics resulting in greater efficiency, which enables the low noise amplifier to operate in wideband rather than narrowband.

BRIEF DESCRIPTION OF THE SEVERAL VIEWS OF THE DRAWINGS

A sample embodiment of the disclosure is set forth in the following description, is shown in the drawings and is particularly and distinctly pointed out and set forth in the appended claims. The accompanying drawings, which are fully incorporated herein and constitute a part of the specification, illustrate various examples, methods, and other example embodiments of various aspects of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

Figure 1:
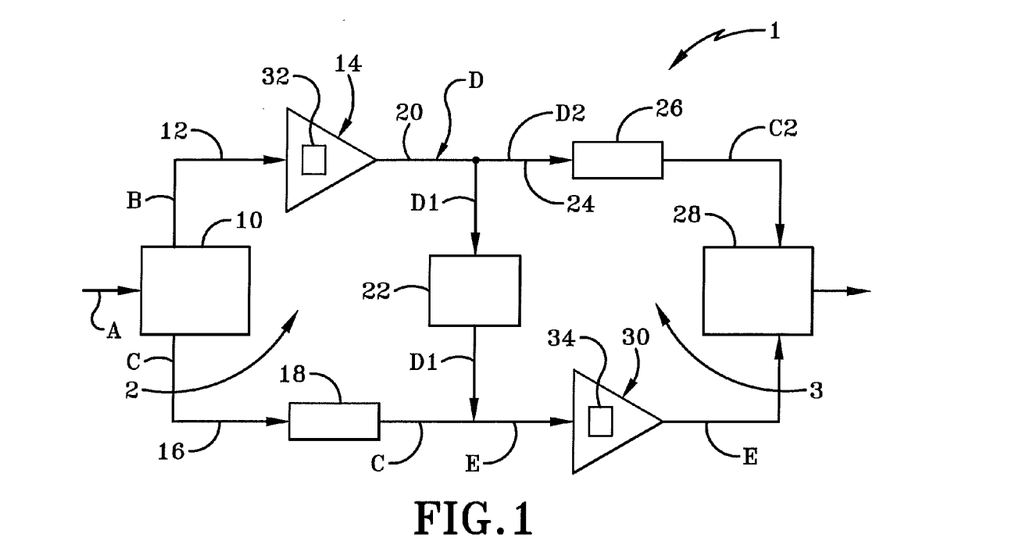
FIG. 1 is a schematic view of a first embodiment of a wideband high dynamic range low noise amplifier in accordance with the present disclosure.

A wideband high dynamic range low noise amplifier (LNA) is depicted in FIG. 1 generally at 1. Wideband LNA 1 may include a wideband power divider 10 (also referred to as an input splitter, or a directional coupler), a first path 12 to an input of a main amplifier 14, a second path 16 to an input of a first delay line 18, a third path 20 as a main amplifier 14 output and a fourth path 24 as a main amplifier 14 output, a wideband resistive coupler or wideband power sampler (directional coupler) 22, a second delay line 26, a wideband output power combiner 28, an error amplifier 30.

A first loop 2 is defined by the power divider 10, the main amplifier 14, the first delay line 18, and the wideband resistive coupler 22. A second loop 3 is defined by the second delay line 26, the error amplifier 30, and the power combiner 28.

Power divider 10 includes one input and two outputs. The input receives a power signal and divides the signal to the two outputs. Power divider 10, or the directional coupler, may be a passive device used to couple part of the transmission power in one transmission line to a second transmission line. This is accomplished by locating a portion of the second transmission line close enough to the first transmission line that the electromagnetic signal passing through the first transmission line is electromagnetically coupled to the second transmission line. In other implementations, power divider 10 may be utilized to sample a very small portion of the RF power going to an antenna while not affecting the received power. Using this sampled-power reading, a device can optimally manage the gain of its power amplifier (PA) stage, and thus its spectrum issues and power consumption. In one particular embodiment, power divider 10 is a multilayer Wilkinson splitter employed to obtain a 18:1 bandwidth. Note: one having ordinary skill in art understands that the 18:1 bandwidth ratio refers to ratio bandwidth commonly associated with wideband antennas and is typically presented in the form of B:1, where B is the total bandwidth.

To minimize Noise Figure, the input splitter 10 must be in a range from 2 decibels (dB) to 4 dB, and in one particular embodiment is 3 dB. When a larger differential in the input splitter 10 is used (such as greater than 4 dB), thermal noise (kTB) is amplified by the error path amplifier and folded in at the output, degrading Noise Figure. This use of a 3 dB input splitter 10 would not be foreseeable or obvious to one having ordinary skill in the art to minimize the Noise Figure.

First path 12 is electrically connected downstream to one of the outputs from power divider 10. First path 12 is an electrically conductive transmission line. In one particular embodiment, first path 12 which is a conductor, is configured using optimum levels of the multilayer monolithic microwave integrated circuit (MMIC) process. When first path 12 is part of a MMIC, the performance of wideband LNA 1 is reproducible and easily manufacturable due to the repeatability and tracking of MMIC components. The conductive components of wideband LNA 1 fabricated from MMIC components allows the elimination of the amplitude/phase adjust and their associated control networks, which are required in conventional LNAs free of MMIC implementations.

Main amplifier 14 amplifiers the signal received from first path 12. Typically, the output signal from the main amplifier contains both the desired signal and distortion. However, main amplifier 14 includes a first phase inverter 32. In one particular example, the first phase inverter 32 may be in the form of a common source amplifier which performs as a phase inverter. The phase inverter 32 enables wideband LNA 1 to eliminate a subtractor function during in-phase summation in the power combiner which is typically required in conventional LNAs. Thus, LNA 1 is a one-stage amplifier. This property holds true for all odd-numbered amplifier stage implementations (i.e., one-stage amplifier, three-stage amplifier, five-stage amplifier, etc.). Main amplifier 12 may utilize a compound transistor called a cascode (common source driving a common gate). The common gate is an in-phase configuration so the subtraction property is unaffected. The cascode has the advantages of improved unilateral properties and the gain of 1.5 stages in the size of a one-stage amplifier. The amplifier circuit is a distributed amplifier for 18:1 bandwidth operation.

Second path 16 is electrically connected downstream to one of the outputs from power divider 10. Second path 16 is an electrically conductive transmission line. In one particular embodiment, Second path 16 which is a conductor, is configured using optimum levels of the MMIC process. Similar to that of first path 12, when second path 16 is part of a MMIC, the performance of wideband LNA 1 is reproducible and easily manufacturable due to the repeatability and tracking of MMIC components.

Delay 18 enables the signal received from second path 16 to be delayed as it passes therethrough. Delay 18 may have inherent resistances. In some instances, delay 18 may deteriorate a noise figure (NF) and in other instances, the resistance of delay 18 is minimal such that the noise figure is not minimized or deteriorated. The delay may be fabricated on an GaAs MMIC substrate. Furthermore, delay 26, which is electrically connected between fourth path 24 and wideband power combiner 28, may be formed similar to that of delay 18.

A wideband resistive coupler or wideband power sampler (directional coupler) 22. Resistive coupler 22 includes resistors as the main element to enable the coupling action to take place. Resistive coupler 22 is advantageous inasmuch as when suitable resistors and construction techniques are used, the frequency response can extend over a wide frequency range. Furthermore, in one particular non-limiting example, resistive coupler 22 is made up from only resistors, which enables resistive coupler 22 to be a low cost solution.

Error amplifier 30 is preferably a low power error amplifier. Error amplifier 30 includes a second phase inverter 34. The second phase inverter 34 is similar to the first phase inverter 32 in the main amplifier 14. In one embodiment, the output signal from the main amplifier 14 contains both the desired signal and distortion. This signal is sampled and scaled using attenuators before being combined with the delayed portion (via delay 18) of the input signal, which is regarded as distortion free. The resulting "error signal" ideally contains only the distortion components of the output of the main amplifier. The error signal is then amplified by the low power error amplifier 30, and then combined with a delayed version (via delay 26) of the main amplifier 14 output. This second combination ideally cancels the distortion components in the main amplifier 14 output while leaving the desired signal unaltered. Successful isolation of an error signal and the removal of distortion components depend upon precise signal cancellation over a band of frequencies. For a 30-dB cancellation depth, the amplitude must be matched within 0.22 dB and the phase within 1.2 degrees. For wideband requirements, realistic values of distortion cancellation are around 6-20 dB. The limiting factors are the bandwidth over which tracking can be obtained and minimization of Voltage Standing Wave Ratio (VSWR) mismatch effects.

A FRAP network is used to set quiescent current bias on the main amplifier 14. A second FRAP network sets the quiescent bias current of the error path amplifier 30. Each "FRAP" is a fusible link resistive voltage divider device. The term FRAP is an acronym for a Fuseable Resistor Airbridge Process. The FRAP network provides advantages as there is significant gate voltage variation on field effect transistors. Thus, during manufacturing die serial numbers must be tracked with on wafer test data or perform select and adjust at test in the module. This is inefficient. With the FRAP, a single negative voltage supply is ran off. For example, −5 Volts is run off, and the appropriate links are blown off during on wafer test. The FRAP process enables every die to look the same, and require little to no tracking or adjustment.

The FRAP device is used to adjust the bias point of biasing circuits at the time of testing. In one exemplary embodiment, the first and second FRAP networks may be on a GaAs wafer with conductive electrical routing and pad components.

Wideband low noise amplifier 1 extends the dynamic range beyond that of a conventional narrowband LNA or some of the other prior art wideband LNAs. Thus, wideband low noise amplifier 11 is consider to have High Dynamic Range (HDR). wideband. More particularly, the prior art wideband LNAs lack wideband efficiency. Heretofore, no prior art wideband LNAs utilize feed forward techniques (i.e., phase inversion), nor do the prior art wide band LNAs utilize monolithic microwave integrated circuits to efficiently accomplished wideband low noise amplification.

In operation, and with respect to wideband LNA 1 and FIG. 1, a powered radio frequency (RF) input signal (Arrow A) is input into or enters wideband power divider 10 (i.e., the input splitter) and is split into two paths, such that input signal A is output from power divider 10 as a first divided signal B and a second divided signal C.

The first divided signal B travels or moves downstream from the first output of power divider 10 along the first path 12 to an input of a main amplifier 14 while the second divided signal C travels or moves downstream from the second output of power divider 10 along the second path 16 to an input of the delay line 18.

Main amplifier 14 amplifies and inverts the first divided signal B (through the use of first phase inverter 32 in main amplifier 14) while also adding distortion to the first divided signal B so that the first divided signal becomes an amplified main amplifier output or main amplifier output signal D and exits an output of the main amplifier 14, and may also be referred to as a distorted output or distorted output signal.

The main amplifier output D is also split into two paths, such that output D travels through the third path 20 as a main amplifier output first divided signal D1 and through the fourth path 24 as a main amplifier output second divided signal D2.

First divided signal D1 is sampled from the output D and enters an input of the wideband resistive coupler or wideband power sampler (directional coupler) 22.

Second divided signal D2 passes from fourth path 24 to and through the second delay line 26 (a length of transmission line) to cause a time delay of signal D2 before entering an input of a wideband output power combiner 28.

Resistive coupler 22 attenuates the main amplifier output divided signal D1 so that when divided signal D1 exits coupler 22, signal D1 is at the same power level as that of the first divided signal B.

Second divided signal C is delayed by and exits an output of delay line 18 and is combined with signal D1 to create an error signal E.

The resistive coupler 22 is high impedance so that the error signal E can be created by connecting coupler 22 and the power divider 10 output divided signal C (i.e., 50 ohms) directly to an input of an error amplifier 30.

Error signal E is inverted by second phase inverter 34 and exits an output of error amplifier 30 as an amplified error signal E which is combined with amplifier output divided signal C2 from main amplifier 14 in the output power combiner 28.

Main amplifier amplified output signal D2 goes through time delay 26 so that signal D2 is time aligned with amplified error signal E prior to entering power combiner 28.

Thus, the amplified error signal E is combined with the time aligned amplifier output divided signal C2 from main amplifier 14 in the output power combiner 28.

So using the properties of phase inversion in the single stage amplifiers 14 and 30, subtraction has been simplified to in-phase summation which is much easier to implement.

Figure 4:
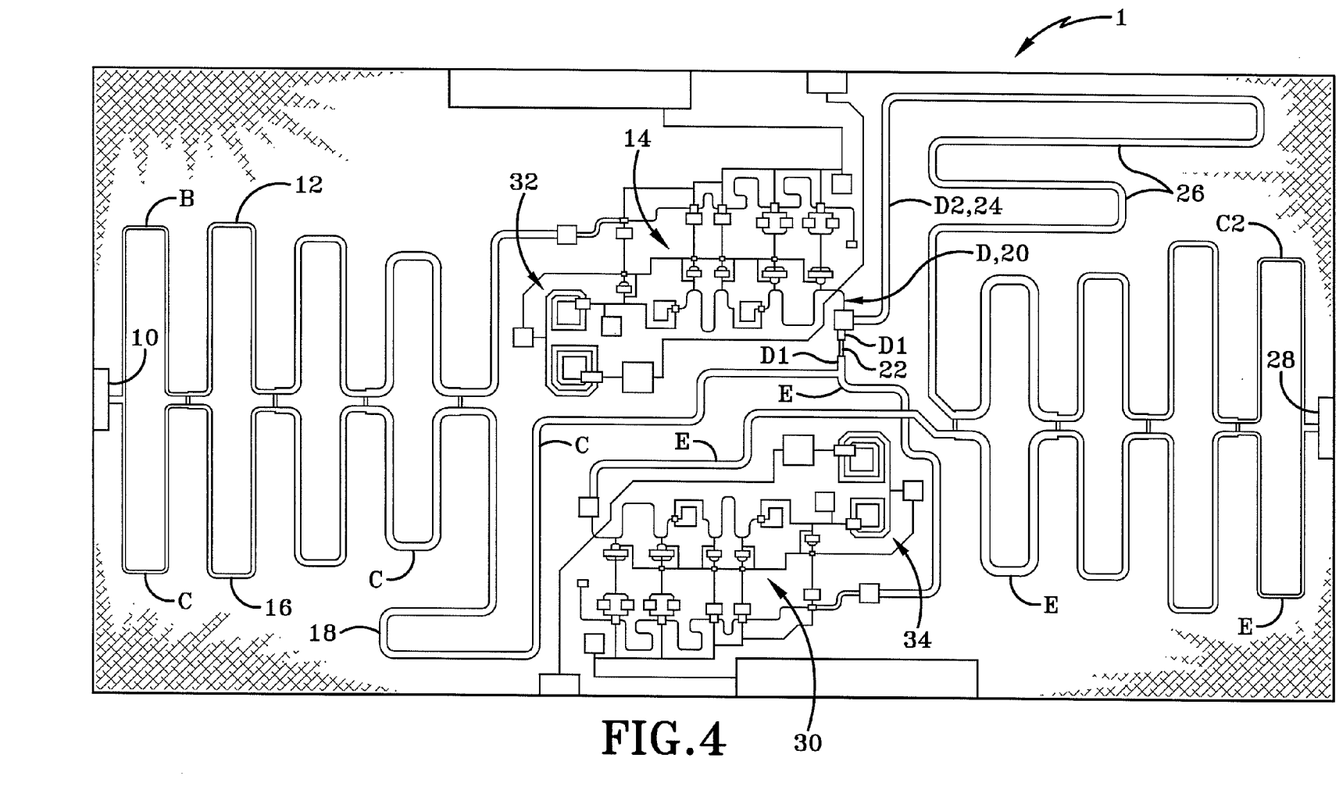
FIG. 4 is an integrated circuit layout of the wideband high dynamic range low noise amplifier of FIG. 1.

FIG. 4 depicts an exemplary integrated circuit layout, also known as an IC layout, or an IC mask layout, or a mask design, which is the representation of wideband high dynamic range LNA 1 that is schematically depicted in FIG. 1. FIG. 4 depicts wideband high dynamic range LNA 1 in terms of planar geometric shapes which correspond to the patterns of metal, oxide, or semiconductor layers that make up the components of the integrated circuit.

Figure 2:
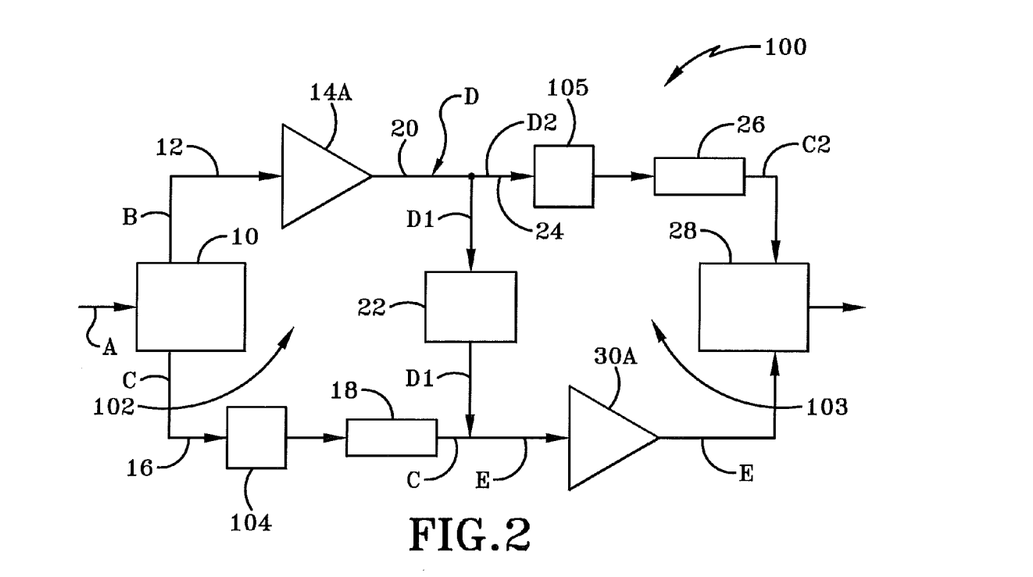
FIG. 2 is a schematic view of a second embodiment of a wideband high dynamic range low noise amplifier in accordance with the present disclosure.

FIG. 2 depicts an alternative embodiment of the present disclosure and shows a wideband high dynamic range LNA generally at 100. Wideband LNA 100 may include the wideband power divider 10, the first path 12 to an input of a main amplifier 14A, the second path 16 to an input of a first phase shifter 104 which leads to the first delay line 18, a third path 20 as the main amplifier 14A output and the fourth path 24 as the main amplifier 14A output, the wideband resistive coupler 22, a second phase shifter 105, the second delay line 26, the wideband output power combiner 28, and an error amplifier 30A.

A first loop 102 is defined by the power divider 10, the main amplifier 14A, the first phase shifter 104, the first delay line 18, and the wideband resistive coupler 22. A second loop 103 is defined by the second phase shifter 105, the second delay line 26, the error amplifier 30A, and the power combiner 28.

Wideband LNA 100 is similar to the first embodiment described above, except rather than including the first and second phase inverters in the main amplifier and the error amplifier, the wideband LNA 100 utilizes phase shifters to shift the signal 180 degrees.

The first phase shifter 104 is electrically connected along the second path 16 between the output from power divider 10 and first delay line 18. The second phase shifter is electrically connected along the fourth path 24 between the output of the main amplifier 14A and the second delay line 26.

The wideband LNA 100 is a two-stage amplifier. As a two-stage amplifier, wideband LNA 100 does not invert signals, thus phase shifting must be introduced. The introduction of the phase inversion is accomplished through a phase shift performed by first phase shifter 104 and second phase shifter 105. More particularly, a 180 degree phase shift is performed by the first and second phase shifters 104, 105. In one embodiment, this may be implemented as a wideband coupler terminated by appropriate lengths of short-circuited transmission lines.

In wideband high dynamic range LNA 100, the subtractor function is required during in-phase summation. This property holds true for all even-numbered amplifier stage implementations (i.e., a two-stage amplifier, a four-stage amplifier, etc.). In one example, it is implemented using a wideband reflective 180 degree phase shifter implemented with a folded 3-section coupler with short-circuited stubs. The center section is implemented as a highly over-coupled Lange quadrature coupler.

Figure 5:
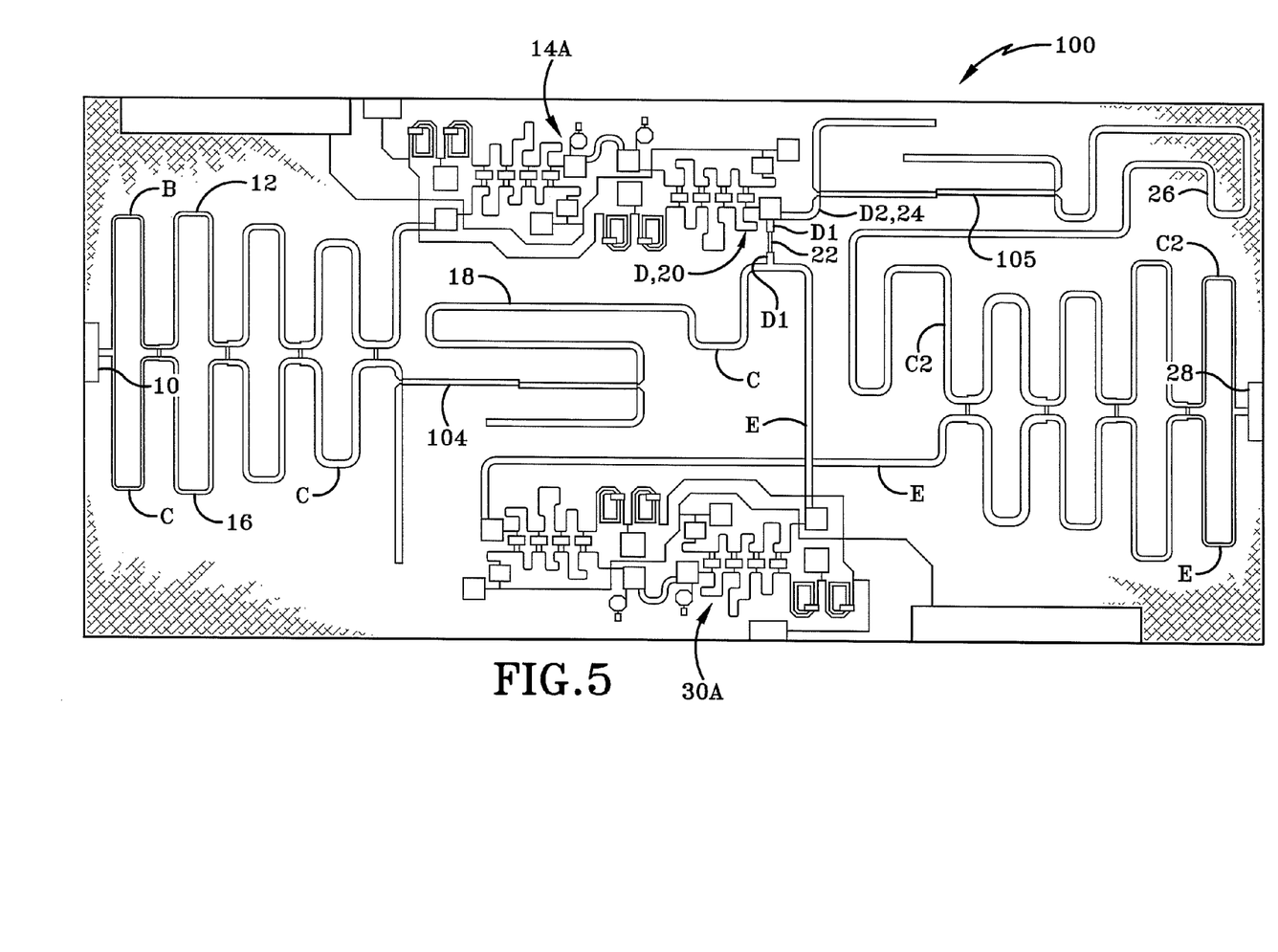
FIG. 5 is an integrated circuit layout of the second embodiment wideband high dynamic range low noise amplifier of FIG. 2.

FIG. 5 depicts an exemplary integrated circuit layout, which is the representation of wideband high dynamic range LNA 100 that is schematically depicted in FIG. 2. FIG. 5 depicts wideband high dynamic range LNA 100 in terms of planar geometric shapes which correspond to the patterns of metal, oxide, or semiconductor layers that make up the components of the integrated circuit.

Figure 3:
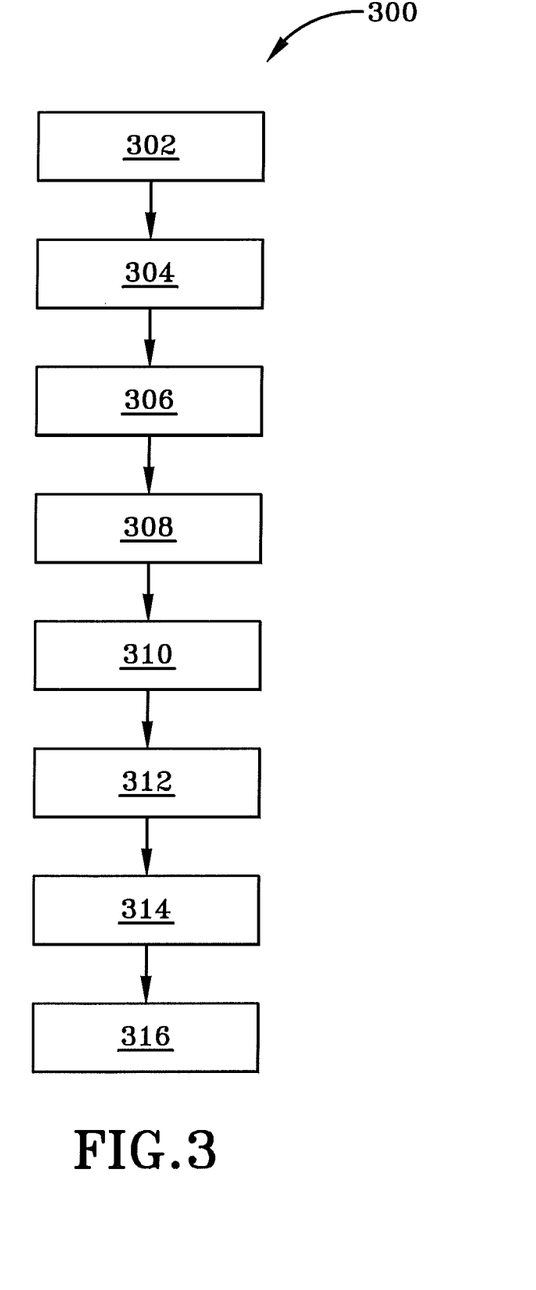
FIG. 3 is a flow chart for an operational method of the first embodiment wideband high dynamic range low noise amplifier.

FIG. 3 depicts an exemplary flow chart of a method 300 utilized with wideband LNA 1. More particularly, method 300 can include the following steps. The step of dividing a powered radio frequency input signal into a first signal and a second signal at an input splitter, is shown generally at 302. Then, the step of inverting the first signal in a main amplifier with a first phase inverter and simultaneously delaying the second signal in a first delay device, is shown generally at 304. Then, the step of amplifying the first signal in the main amplifier and creating distortion in the first signal when first signal is amplified, is shown generally at 306. Then, the step of outputting the amplified first signal with distortion from the main amplifier, is shown generally at 308. Then, the step of attenuating the amplified first signal with distortion to the input signal level with a resistive coupler, is shown generally at 310. Then, the step of sending a portion of the amplified first signal through a second delay device to time align the first and second signals, is shown generally at 312. Then, the step of inverting the second signal in an error amplifier with a second phase inverter and amplifying the second signal to create an amplified second signal, is shown generally at 314. Then, the step of combining the amplified second signal with the portion of the amplified first signal sent through the second delay in a power combiner, is shown generally at 316. The first phase inverter 32 in the main amplifier 14 and the second phase inverter 34 in the error amplifier 30 are adapted to eliminate a subtraction function for in-phase phase summation. Various of these steps may occur simultaneously as will be understood from the figures.

Wideband high dynamic range LNA 1 recognizes that a common source or cascode single-stage amplifier inverts the phase so the subtraction function in feedforward becomes an addition, which is much simpler to implement. Feedforward amplifiers historically have been narrowband, built with discrete components, require amplitude and phase adjustment. Wideband high dynamic range LNA 1 having MMIC components eliminates the variability and parasitics that limit bandwidth and require adjustment. The 3 dB split at splitter 10 is optimum for minimum noise figure in an LNA 1. For other splits, amplified out of band noise in the error amp may be folded in degrading noise figure. Wideband high dynamic range LNA 1 achieves a 1 GHz to 18 GHz high dynamic range LNA using feedforward. Feedforward breaks the paradigm of double DC power for a 3 dB decrease in distortion. Wideband LNA 1 demonstrates a 6 dB minimum on 3rd order and 20 dB minimum on 2nd order.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of the preferred embodiment of the disclosure are an example and the disclosure is not limited to the exact details shown or described.

What is claimed:

1. A wideband low noise amplifier (LNA) having high dynamic range comprising:
    an input splitter to split a radio frequency power signal into a signal first pathway and a signal second pathway;
    a main amplifier including a first wideband phase inverter electrically connected downstream from the input splitter along the first pathway;
    an error amplifier including a second wideband phase inverter electrically connected downstream from the input splitter and parallel to the main amplifier along the second pathway;
    a combiner electrically connected downstream to the main amplifier and the error amplifier merging the signal first and second pathways into a combined signal pathway; and
    wherein the first wideband phase inverter and the second wideband phase inverter eliminate any subtraction function during an in-phase summation at the combiner.

2. The wideband LNA of claim 1, wherein the input splitter includes a first outlet and a second outlet, wherein the first outlet is connected to the main amplifier and the second outlet is connected to the error amplifier, and the first and second outlet each have a decibel (dB) loss in a range from 2 dB to 4 dB.

3. The wideband LNA of claim 2, wherein the loss at the first outlet and the second outlet is 3 dB.

4. The wideband LNA of claim 1, wherein a 18:1 bandwidth is obtained.

5. A wideband low noise amplifier (LNA) having high dynamic range comprising:
   an input splitter to split a radio frequency power signal equally into a signal first pathway and a signal second pathway;
   a main amplifier including a first wideband phase inverter electrically connected downstream from the input splitter along the first pathway;
   an error amplifier including a second wideband phase inverter electrically connected downstream from the input splitter and parallel to the main amplifier along the second pathway;
   a combiner electrically connected downstream to the main amplifier and the error amplifier merging the signal first and second pathways into a combined signal pathway;
   wherein the first wideband phase inverter and the second wideband phase inverter eliminate any subtraction function during an in-phase summation at the combiner; and
   monolithic microwave integrated circuit (MMIC) optimized conductors defining: an electrical connection between the input splitter and the main amplifier, an electrical connection between the input splitter and the error amplifier, an electrical connection between the main amplifier and the combiner, and an electrical connection between the error amplifier and the combiner.

6. The wideband LNA of claim 5, wherein the MMIC optimized conductors permit the wideband LNA to be free of amplitude and phase adjusting means and associated control networks.

7. The wideband LNA of claim 1, further comprising a first FRAP network to set quiescent bias current of the main amplifier.

8. The wideband LNA of claim 7, further comprising a second FRAP network to set the quiescent bias current of the error amplifier.

9. The wideband LNA of claim 1, further comprising an odd-numbered amplifier stage implementation free of any subtraction function during an in-phase summation at the combiner.

10. The wideband LNA of claim 1, further comprising a cascode transistor including a common source driving a common gate, wherein the common gate is configured in-phase establishing an unaffected subtraction property.

11. The wideband LNA of claim 10, wherein the cascode transistor establishes the gain of 1.5 stages in the size of a one-stage amplifier.

12. A method for a wideband low noise amplifier (LNA) comprising the steps of:
   dividing a powered radio frequency input signal equally into a first signal and a second signal at an input splitter;
   inverting the first signal in a main amplifier with a first phase inverter and simultaneously delaying the second signal in a first delay device;
   amplifying the first signal in the main amplifier and creating distortion in the first signal when first signal is amplified;
   outputting the amplified first signal with distortion from the main amplifier;
   attenuating the amplified first signal with distortion to the input signal level with a resistive coupler;
   sending a portion of the amplified first signal through a second delay device to time align the first and second signals;
   inverting the second signal in an error amplifier with a second phase inverter and amplifying the second signal to create an amplified second signal; and
   combining the amplified second signal with the portion of the amplified first signal sent through the second delay in a power combiner;
   wherein the first phase inverter in the main amplifier and the second phase inverter in the error amplifier to eliminate any subtraction function during in-phase phase summation at the combiner.

13. The method of claim 12, wherein prior to the step of dividing the powered RF input signal comprises the steps of:
   providing monolithic microwave integrated circuit (MMIC) optimized conductors as the electrical connections between: the input splitter and the main amplifier, the input splitter and the error amplifier, the main amplifier and the power combiner, and the error amplifier and the power combiner; and
   precluding amplitude and phase adjusting means and associated control networks.

14. The method of claim 13, further comprising the step of selectively setting the input splitter to have a 3 decibel loss in order to minimize Noise Figure.

15. The method of claim 14, further comprising the step of establishing a 18:1 bandwidth at the input splitter.

16. The method of claim 15, further comprising the steps of: selectively setting a quiescent current bias on the main amplifier with a first FRAP network; and selectively setting a quiescent current bias on the error amplifier with a second FRAP network.

17. The method of claim 12, wherein the first phase inverter is a common source amplifier, and further comprising the steps of:
   eliminating a subtraction function from in-phase phase summation in the power combiner.

18. The method of claim 16, wherein the step of eliminating the subtraction function is accomplished by a cascode transistor increasing the gain of 1.5 stages in the size of a one-stage amplifier.

19. The method of claim 12, wherein the step of outputting the amplified first signal with distortion further comprises the step of:
   splitting the amplified first signal with distortion into a third path and a fourth path; and
   sampling the amplified first signal with distortion from the third path with a wideband power sampler.

20. The method of claim 12, wherein the resistive coupler is high impedance; and wherein the input splitter output for the second signal is at least 50 ohms.

21. A wideband low noise amplifier (LNA) having high dynamic range comprising:
   an input splitter to split a radio frequency power signal equally into a signal first pathway and a signal second pathway;
   a main amplifier electrically connected downstream from the input splitter along the first pathway;
   an error amplifier electrically connected downstream from the input splitter and parallel to the main amplifier along the second pathway;
   a combiner electrically connected downstream to the main amplifier and the error amplifier merging the signal first and second pathways into a combined signal pathway;

wherein the main amplifier and the error amplifier eliminate any subtraction function during an in-phase summation at the combiner;
a first fusible link resistor (FRAP) network to set quiescent bias current of the main amplifier; and
a second FRAP network to set the quiescent bias current of the error amplifier.

\* \* \* \* \*